United States Patent
Kamada et al.

(10) Patent No.: US 10,989,733 B2
(45) Date of Patent: Apr. 27, 2021

(54) ACCELERATION SENSOR, GEOPHONE, AND SEISMIC PROSPECTING SYSTEM

(71) Applicant: HITACHI, LTD., Tokyo (JP)

(72) Inventors: Yuudai Kamada, Tokyo (JP); Atsushi Isobe, Tokyo (JP); Noriyuki Sakuma, Tokyo (JP); Takashi Shiota, Tokyo (JP); Chisaki Takubo, Tokyo (JP)

(73) Assignee: HITACHI, LTD., Tokyo (JP)

( * ) Notice: Subject to any disclaimer, the term of this patent is extended or adjusted under 35 U.S.C. 154(b) by 523 days.

(21) Appl. No.: 15/756,279

(22) PCT Filed: Nov. 8, 2016

(86) PCT No.: PCT/JP2016/083015
§ 371 (c)(1),
(2) Date: Feb. 28, 2018

(87) PCT Pub. No.: WO2017/110272
PCT Pub. Date: Jun. 29, 2017

(65) Prior Publication Data
US 2018/0321274 A1    Nov. 8, 2018

(30) Foreign Application Priority Data

Dec. 25, 2015 (JP) .............................. JP2015-254352

(51) Int. Cl.
*G01P 15/125* (2006.01)
*G01P 15/13* (2006.01)
(Continued)

(52) U.S. Cl.
CPC ............ *G01P 15/125* (2013.01); *G01P 15/13* (2013.01); *G01R 19/0084* (2013.01);
(Continued)

(58) Field of Classification Search
CPC .................. G01P 15/125; G01P 15/13; G01P 2015/0862; G01R 19/0084; G01V 1/003; G01V 1/181; G01V 1/28; G01V 1/30
See application file for complete search history.

(56) References Cited

U.S. PATENT DOCUMENTS 6,841,992 B2 *  1/2005  Yue ..................... G01P 15/125
                                                    324/162
6,935,175 B2 *  8/2005  Eskridge ............. G01P 15/0802
                                                    73/514.21
(Continued)

FOREIGN PATENT DOCUMENTS

JP      2009-10949 A    5/2009
JP     2010-517014 A    5/2010
(Continued)

OTHER PUBLICATIONS

International Search Report of PCT/JP2016/083015 dated Feb. 7, 2017.

*Primary Examiner* — Krystine E Breier
(74) *Attorney, Agent, or Firm* — Mattingly & Malur, PC

(57) ABSTRACT

Provided are acceleration sensor, geophone and seismic prospecting system with high sensitivity and low power consumption. The acceleration sensor includes a mass body displaceable with respect to a rotation shaft. The acceleration sensor includes a first AC servo control facing a first symmetrical region of the first movable portion, a second AC servo control electrode facing a second symmetrical region of the second movable portion, and a DC servo control electrode facing an asymmetrical region of the second movable portion. A first AC servo capacitive element is formed by the first movable portion and the first AC servo control electrode, a second AC servo capacitive element is formed by the second movable portion and the second AC servo control electrode, and a DC servo capacitive element is formed by the second movable portion and the DC servo control electrode.

6 Claims, 9 Drawing Sheets

(51) Int. Cl.
  *G01V 1/28* (2006.01)
  *G01V 1/00* (2006.01)
  *G01R 19/00* (2006.01)
  *G01V 1/18* (2006.01)
  *G01V 1/30* (2006.01)
  *G01P 15/08* (2006.01)

(52) U.S. Cl.
  CPC .............. *G01V 1/003* (2013.01); *G01V 1/181* (2013.01); *G01V 1/28* (2013.01); *G01V 1/30* (2013.01); *G01P 2015/0862* (2013.01)

(56) References Cited

U.S. PATENT DOCUMENTS

| | | | | |
|---|---|---|---|---|
| 7,578,190 B2 * | 8/2009 | Lin | ........................ | G01P 15/125 |
| | | | | 73/514.29 |
| 7,610,809 B2 * | 11/2009 | McNeil | ................ | G01P 15/125 |
| | | | | 73/514.32 |
| 9,341,646 B2 * | 5/2016 | Stewart | ................ | G01P 15/125 |
| 10,371,714 B2 * | 8/2019 | Chien | ................ | G01P 15/0802 |
| 10,527,642 B2 * | 1/2020 | Isobe | ................... | G01P 15/125 |
| 10,585,112 B2 * | 3/2020 | Oshima | ................. | G01P 15/131 |
| 10,697,995 B2 * | 6/2020 | Isobe | ................... | G01P 15/125 |
| 10,802,040 B2 * | 10/2020 | Isobe | ................... | G01P 15/125 |
| 2004/0079154 A1 * | 4/2004 | Yoshikawa | .......... | G01P 15/125 |
| | | | | 73/514.32 |
| 2004/0160232 A1 * | 8/2004 | Yue | ....................... | G01P 15/131 |
| | | | | 324/660 |
| 2009/0107238 A1 * | 4/2009 | Guo | .................... | G01P 15/0802 |
| | | | | 73/514.32 |
| 2012/0182832 A1 * | 7/2012 | Eperjesi | ................ | G01V 1/223 |
| | | | | 367/77 |
| 2014/0165691 A1 | 6/2014 | Stewart | | |
| 2014/0352434 A1 | 12/2014 | Henrickson et al. | | |
| 2016/0091525 A1 * | 3/2016 | Oshima | ................ | G01P 15/125 |
| | | | | 73/514.32 |
| 2018/0321274 A1 * | 11/2018 | Kamada | ................... | G01V 1/30 |

FOREIGN PATENT DOCUMENTS

| | | |
|---|---|---|
| JP | 2014-122893 A | 7/2014 |
| JP | 2014-235169 A | 12/2014 |

* cited by examiner (a)

(b)

(a)

(b)

(a)

(b)

(a)

(b)

ACCELERATION SENSOR, GEOPHONE, AND SEISMIC PROSPECTING SYSTEM

TECHNICAL FIELD

The present invention relates to an acceleration sensor, a geophone, and a seismic prospecting system, and more particularly, an effective technique applied to an acceleration sensor for detecting micro-vibration acceleration, a geophone equipped with an acceleration sensor, and a seismic prospecting system including a plurality of geophones.

BACKGROUND ART

Published Japanese Patent Translation No. 2010-517014 (PTL 1) discloses a technology relating to a capacitive accelerometer having a seesaw structure. Specifically, disclosed in a movable element structure in which sensing electrodes are arranged to be symmetric with respect to a rotation shaft, and actuation electrodes are arranged to be far from the rotation shaft as viewed from the rotation shaft.

CITATION LIST

Patent Literature

PTL 1: Published Japanese Patent Translation No. 2010-517014

SUMMARY OF INVENTION

Technical Problem

Reflective seismic prospecting is a method in which shock waves or continuous waves are generated on the ground surface, reflected waves reflected from the underground reflective surface (boundary surface where acoustic impedance changes) to come back to the ground is measured by a geophone deployed on the ground surface and is analyzed, so that a depth distribution and a subsurface structure of the underground reflective surface are prospected. For example, the reflective seismic prospecting has been widely used as a main prospecting method of oil and natural gas. In particular, as a next-generation reflective seismic prospecting sensor, an acceleration sensor that detects a vibration acceleration much smaller than the gravitational acceleration has attracted attention. In order to put such an acceleration sensor into practical use, it is preferable to develop an acceleration sensor with low noise, very high sensitivity, and low power consumption. In addition, it is preferable to implement the acceleration sensor with a micro electro mechanical system (MEMS) in order to operate in a miniaturized device.

An object of the present invention is to provide an acceleration sensor with high sensitivity and low power consumption, a geophone equipped with an acceleration sensor, and a seismic prospecting system including a plurality of geophone.

The above and other objects and noble features of the present invention will become apparent from the description of this specification and the accompanying drawings.

Solution to Problem

Outline of representative ones of the present inventions disclosed in this application will be described in brief, as follows.

An acceleration sensor according to one embodiment is an acceleration sensor including a mass body displaceable in a first direction with respect to a rotation shaft. The mass body includes a first movable portion including a conductor in one direction of the rotation shaft and a second movable portion including a conductor in the other direction of the rotation shaft and having an area larger than the first movable portion. The acceleration sensor includes: a first AC servo control electrode arranged to face a first symmetrical region formed in the first movable portion and a second AC servo control electrode formed in the second movable portion and arranged to face a second symmetrical region which is axially symmetric with the first symmetrical region with respect to the rotation shaft; and a DC servo control electrode formed in the second movable portion and arranged to face an asymmetrical region which is a region outside the second symmetrical region. In addition, a first AC servo capacitive element is formed by the first movable portion and the first AC servo control electrode, a second AC servo capacitive element is formed by the second movable portion and the second AC servo control electrode, and a DC servo capacitive element is formed by the second movable portion and the DC servo control electrode. Furthermore, in order to provide an equilibrium force in which the mass body is controlled to a certain position, an AC voltage is applied to the first AC servo control electrode and the second AC servo control electrode, and a DC voltage is applied to the DC servo control electrode.

A geophone according to one embodiment is a geophone equipped with an acceleration sensor including a mass body displaceable in a first direction with respect to a rotation shaft. The mass body of the acceleration sensor includes a first movable portion including a conductor in one direction of the rotation shaft and a second movable portion including a conductor in the other direction of the rotation shaft and having an area larger than that of the first movable portion. In the acceleration sensor, a DC servo capacitive element is formed by the second movable portion and a DC servo control electrode formed in the second movable portion and arranged to face an asymmetrical region which is a region outside a symmetrical region of the first movable portion and the second movable portion. An angle formed between the first direction and a direction of gravitational acceleration applied to the mass body is measured by using a DC voltage applied to the DC servo control electrode.

A seismic prospecting system according to one embodiment is a seismic prospecting system including a plurality of geophones equipped with an acceleration sensor including a mass body displaceable in a first direction with respect to a rotation shaft. The mass body of the acceleration sensor includes a first movable portion including a conductor in one direction of the rotation shaft and a second movable portion including a conductor in the other direction of the rotation shaft and having an area larger than that of the first movable portion. In the acceleration sensor, a DC servo capacitive element is formed by the second movable portion and a DC servo control electrode formed in the second movable portion and arranged to face an asymmetrical region which is a region outside a symmetrical region of the first movable portion and the second movable portion. An angle formed between the first direction and a direction of gravitational acceleration applied to the mass body is measured by using a DC voltage applied to the DC servo control electrode.

Advantageous Effects of Invention

Effects obtained by representative ones of the present inventions disclosed in this application will be described in brief, as follows.

According to one embodiment, it is possible to provide an acceleration sensor with high sensitivity and low power consumption, a geophone equipped with an acceleration sensor, and a seismic prospecting system including a plurality of geophones.

DESCRIPTION OF EMBODIMENTS

Figure 1:
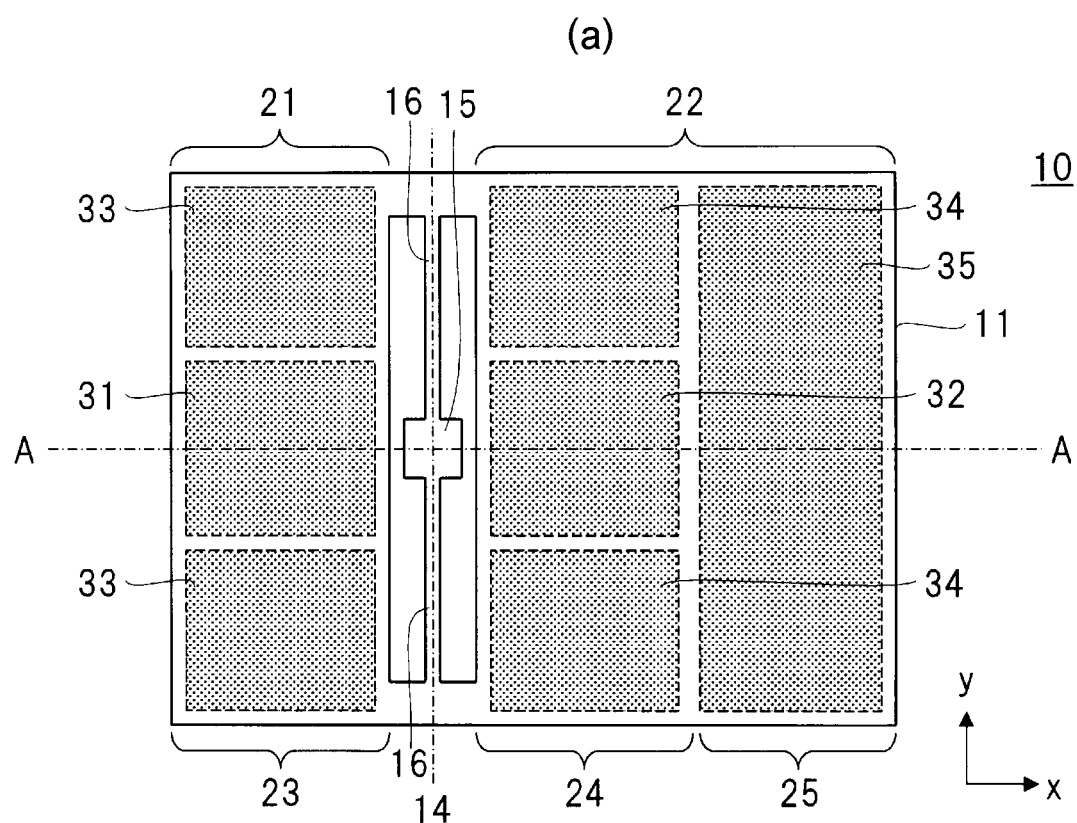
FIG. 1(a) is a plan view illustrating an example of a device structure of a sensor element of an acceleration sensor according to an embodiment.
FIG. 1(b) is a cross-sectional view taken along line A-A of FIG. 1(a).
Figure 1:
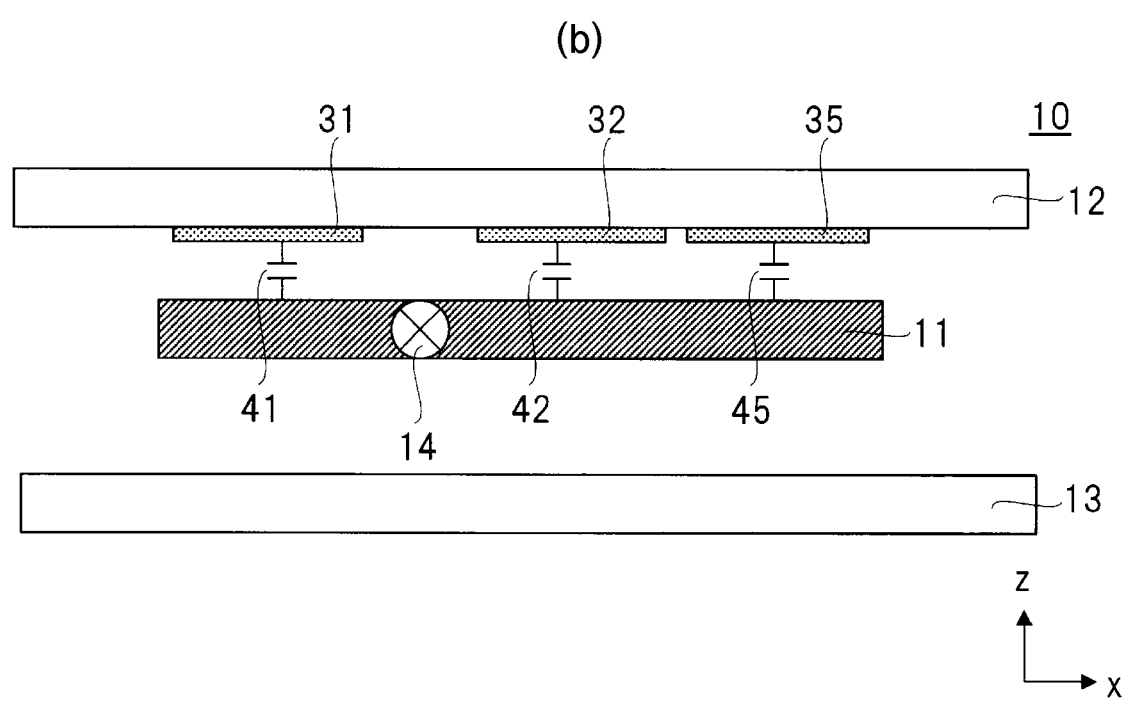

In the following embodiments, if necessary for the convenience, the description will be made by being divided into a plurality of sections or embodiments, but unless otherwise stated, those are not unrelated to one another, and the one is a modification of a portion or all of the other, detail, supplementary explanation, and the like.

In addition, in the following embodiments, in the case where the number of elements (including the number, numerical values, amounts, ranges, or the like) is referred to, particularly unless explicitly stated and unless clearly limited to a specific number in principle, the number of elements is be not limited to a specific number, and it may be a specific number or more and the specific number or less.

Furthermore, in the following embodiments, it should be noted that the constituent elements (including element steps or the like) are not necessarily indispensable particularly unless explicitly stated and unless obviously indispensable in principle.

Similarly, in the following embodiments, when referring to shapes, positional relationships, and the like of constituent elements and the like, unless otherwise explicitly stated or unless obviously stated in principle, substantially approximate or similar shapes are included in the shape or the like. This also applies to the above-described numerical values and ranges.

In addition, in all the drawings for describing the embodiments, the same components are basically denoted by the same reference numerals, and the redundant description thereof will be omitted. In addition, for the better understanding of the drawings, hatching is sometimes applied even to a plan view, and hatching may be omitted even in a cross-sectional view.

<Room for Improvement>

In the technique disclosed in the above-mentioned PTL 1, the sensing electrodes are arranged to be symmetric with respect to the rotation shaft, and the actuation electrodes are arranged on the extending portions of the one movable portion. Accordingly, with the technique disclosed in PTL 1, the entire surface area of the movable portion is effectively utilized, and thus, the effect of miniaturization can be obtained. However, according to the technique disclosed in PTL 1, there is a problem in that bidirectional actuation of the movable portion cannot be implemented unless capacitances are formed on both surfaces of one surface (front surface) and the other surface (back surface) of the extending portions. In addition, in the case of forming capacitances on both surfaces, unless the distance between the movable portion and the fixed electrode formed on the front surface side and the distance between the movable portion and the fixed electrode formed on the back surface side are not exactly coincident with each other, the operation of the acceleration sensor may be adversely influenced, which leads to manufacturing problems.

Therefore, in the embodiments, the room for improvement existing in the technique in the above-described related art has been contrived. Hereinafter, the technical idea of this embodiment of which the room for improvement has been contrived will be described with reference to the drawings.

<Configuration of Acceleration Sensor Element According to Embodiment>

FIG. 1 is a view illustrating an example of a device structure of a sensor element of an acceleration sensor according to the embodiment. FIG. 1(a) is a plan view illustrating the example of the device structure of the sensor element of the acceleration sensor, and FIG. 1(b) is a cross-sectional view taken along line A-A of FIG. 1(a). FIG. 1(a) illustrates a plan view of a portion of a mass body 11, and each of electrodes 31 to 35 on an upper substrate 12 facing the mass body 11 is indicated by a broken line.

As illustrated in FIG. 1, an acceleration sensor element 10 according to the embodiment is configured with three layers of a mass body 11, an upper substrate 12, and a lower substrate 13. When a signal (acceleration) is externally applied, the mass body 11 is vibrated through a spring portion 16 supported by a fixed portion 15 with respect to a rotation shaft 14 formed in the y axis direction. For example, in FIG. 1(b), the mass body 11 vibrates in the +z direction and in the −z direction. Namely, when acceleration is applied, the mass body 11 can be displaced in the z direction, which is a first direction, with respect to the rotation shaft 14.

When the x coordinate of the rotation shaft 14 is set to 0, the mass body 11 is configured to include a first movable portion 21 positioned in the −x direction including a conductor and a second movable portion 22 positioned in the +x direction including a conductor, and the first movable portion 21 and the second movable portion 22 are different in mass. Furthermore, the first movable portion 21 and the second movable portion 22 have an asymmetric structure having different areas, and in the case where the first movable portion 21 is defined as a first symmetrical region 23, the second movable portion 22 is configured to include a second symmetrical region 24 axially symmetric with the first symmetrical region 23 with respect to the rotation shaft 14 and an asymmetrical region 25 outside the second symmetrical region 24. In FIG. 1, the asymmetrical region 25 is formed in a region extending the second symmetrical region 24 in the x direction, but the asymmetrical region may be formed in a region extending in the y direction. Alternatively, the asymmetrical region may be formed in a region extending in both the x direction and the y direction. In general, the mass of the second movable portion 22 having a larger area is larger than that of the first movable portion 21, but the present invention is not limited thereto.

In the upper substrate 12, in a region facing the first symmetrical region 23, a first signal detection electrode 31 and two first AC servo control electrodes 33 are arranged, and a first signal detection capacitive element 41 and two first AC servo capacitive elements 43 are formed between the first movable portion 21 and the first signal detection electrode 31 and between the first movable portion 21 and the two first AC servo control electrodes 33. With respect to the first signal detection capacitive element 41 and the two first AC servo capacitive elements 43, the first signal detection electrode 31 and the two first AC servo control electrodes 33 of the upper substrate 12 serve as fixed electrodes, and the first movable portion 21 serves as a movable electrode. In FIG. 1(b), two first AC servo capacitive elements 43 are not illustrated, but the AC servo capacitive elements are illustrated when the portion of the first AC servo control electrode 33 is set to line A-A. The two first AC servo control electrodes 33 are arranged so as to interpose the first signal detection electrode 31 in the y direction.

In addition, in the upper substrate 12, in a region facing the second symmetrical region 24, a second signal detection electrode 32 and two second AC servo control electrodes 34 are arranged, and a second signal detection capacitive element 42 and two second AC servo capacitive elements 44 are formed between the second movable portion 22 and the second signal detection electrode 32 and between the second movable portion 22 and the two second AC servo control electrodes 34. With respect to the second signal detection capacitive element 42 and the two second AC servo capacitive elements 44, the second signal detection electrode 32 and the two second AC servo control electrodes 34 of the upper substrate 12 serve as fixed electrodes, and the second movable electrode 22 serves as a movable electrode. In addition, in FIG. 1(b), two second AC servo capacitive elements 44 are not illustrated, but the AC servo capacitive elements are illustrated when the portion of the second AC servo control electrode 34 is set to line A-A. The two second AC servo control electrodes 34 are arranged so as to interpose the second signal detection electrode 32 in the y direction.

In the upper substrate 12, in a region facing the asymmetrical region 25, a DC servo control electrode 35 is arranged, and a DC servo capacitive element 45 is formed between the second movable portion 22 and the DC servo control electrode 35. In the DC servo capacitive element 45, the DC servo control electrode 35 of the upper substrate 12 serves as a fixed electrode, and the second movable portion 22 serves as a movable electrode.

At this time, it is preferable that the electrodes constituting each capacitor are arranged so as to be symmetric with respect to the axis in the x direction. In FIG. 1, the two first AC servo control electrodes 33 are arranged so as to be symmetric with respect to the axis (line A-A) in the x direction. In addition, the two second AC servo control electrodes 34 are arranged so as to be symmetric with respect to the axis (line A-A) in the x direction. In addition, each of the first signal detection electrode 31, the second signal detection electrode 32, and the DC servo control electrode 35 is arranged so as to be symmetric with respect to the axis (line A-A) in the x direction.

Furthermore, it is preferable that the electrodes formed in the first symmetrical region 23 and the second symmetrical region 24 are arranged so as to be symmetrical with respect to the rotation shaft 14. In FIG. 1, the first signal detection electrode 31 and the second signal detection electrode 32 are arranged so as to be symmetric with respect to the rotation shaft 14. In addition, the two first AC servo control electrodes 33 and two second AC servo control electrodes 34 are arranged so as to be symmetric with respect to the rotation shaft 14.

In other words, with respect to such an arrangement relationship, the arrangement relationship among the first signal detection electrode 31, the second signal detection electrode 32, the first AC servo control electrode 33, and the second AC servo control electrode 34 is not limited to the example illustrated in FIG. 1.

Figure 2:
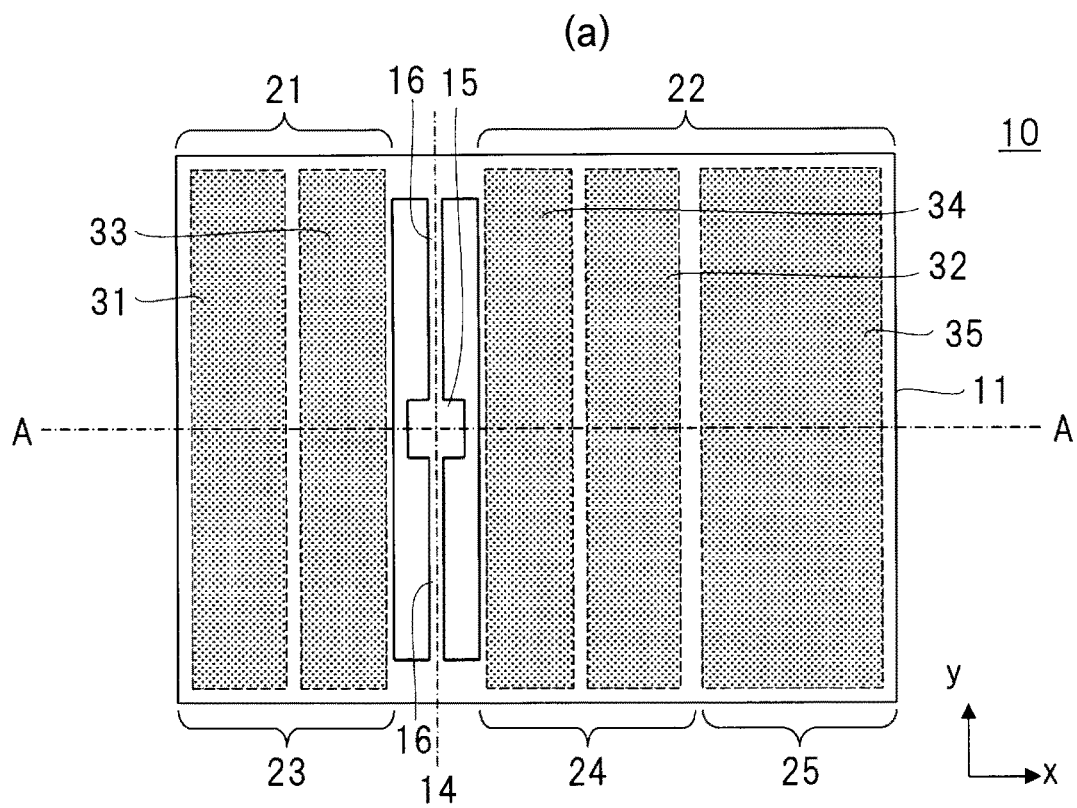
FIG. 2(a) is a plan view illustrating an example of a device structure of a sensor element in a modified example.
FIG. 2(b) is a cross-sectional view taken along line A-A of FIG. 2(a).
Figure 2:
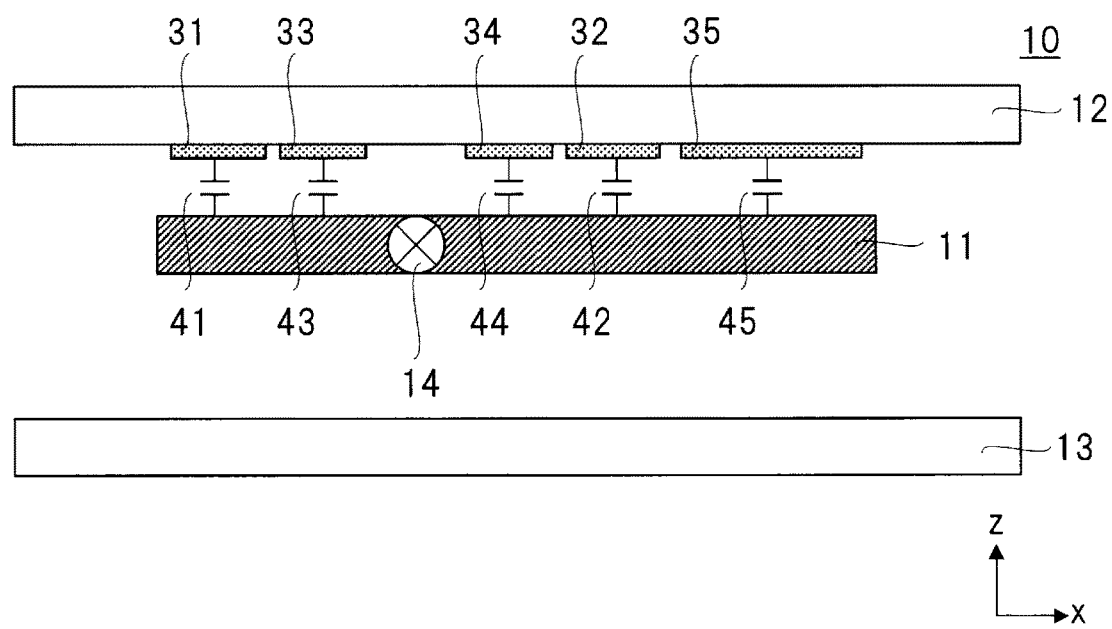

For example, the arrangement relationship as illustrated in FIG. 2 may be used. FIG. 2 is a view illustrating an example of a device structure of a sensor element in a modified example, FIG. 2(a) is a plan view, FIG. 2(b) is a cross-sectional view taken along the line A-A of FIG. 2(a). In the example illustrated in FIG. 2, in the upper substrate 12, in a region facing the first symmetrical region 23, each of a first signal detection electrode 31 and a first AC servo control electrode 33 is formed extending in the y direction and arranged to be symmetric with respect to the axis (line A-A) in the x direction. A first signal detection capacitive element 41 and a first AC servo capacitive element 43 are formed between the first signal detection electrode 31 formed on the upper substrate 12 and the first movable portion 21 and between the first AC servo control electrode 33 formed on the upper substrate 12 and the first movable portion 21, respectively.

In addition, in the upper substrate 12, in a region facing the second symmetrical region 24, the second signal detection electrode 32 and the second AC servo control electrode 34 are formed extending in the y direction and arranged so as to be symmetric with respect to the axis (line A-A) in the x direction. The second signal detection capacitive element 42 and the second AC servo capacitive element 44 are formed between the second signal detection electrode 32 formed on the upper substrate 12 and the second movable portion 22 and between the second AC servo control electrode 34 formed on the upper substrate 12 and the second movable portion 22, respectively.

In addition, the first signal detection electrode 31 and the second signal detection electrode 32 are arranged so as to be symmetric with respect to the rotation shaft 14. In addition, the first AC servo control electrode 33 and the second AC servo control electrode 34 are arranged so as to be symmetric with respect to the rotation shaft 14. The first AC servo control electrode 33 is arranged at a position closer to the rotation shaft 14 than the first signal detection electrode 31. The second AC servo control electrode 34 is arranged at a position closer to the rotation shaft 14 than the second signal detection electrode 32.

Figure 3:
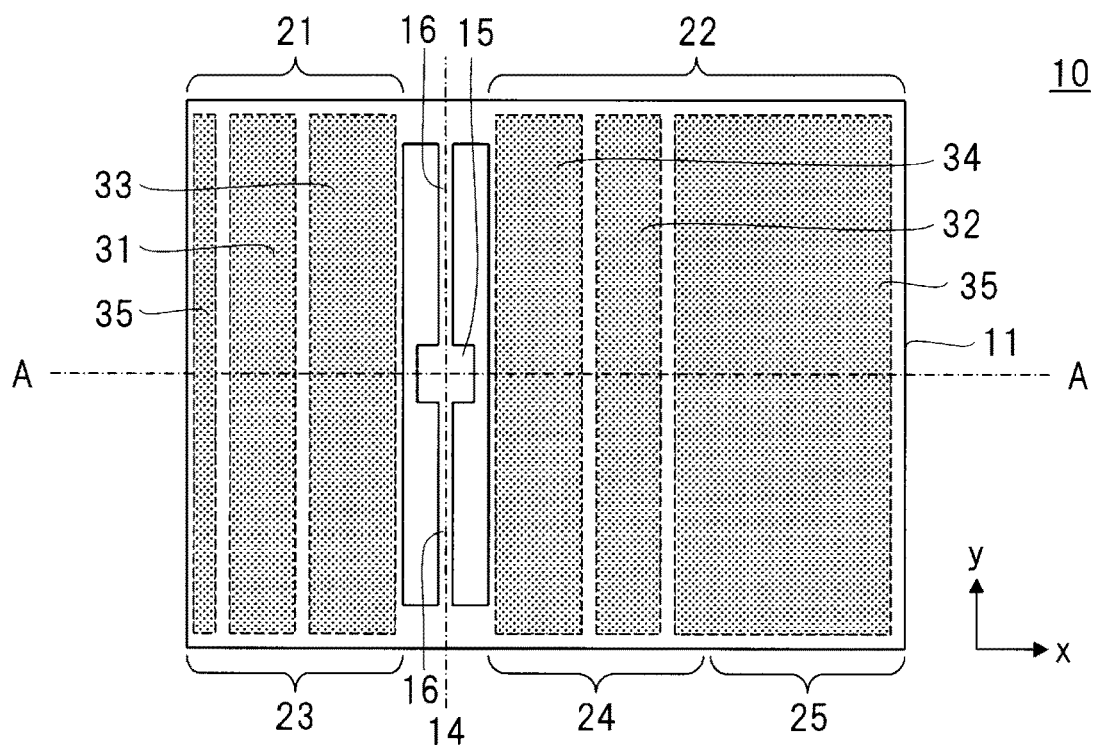
FIG. 3(a) is a plan view illustrating an example of a device structure of a sensor element in another modified example.
FIG. 3(b) is a cross-sectional view taken along line A-A in FIG. 3(a).
Figure 3:
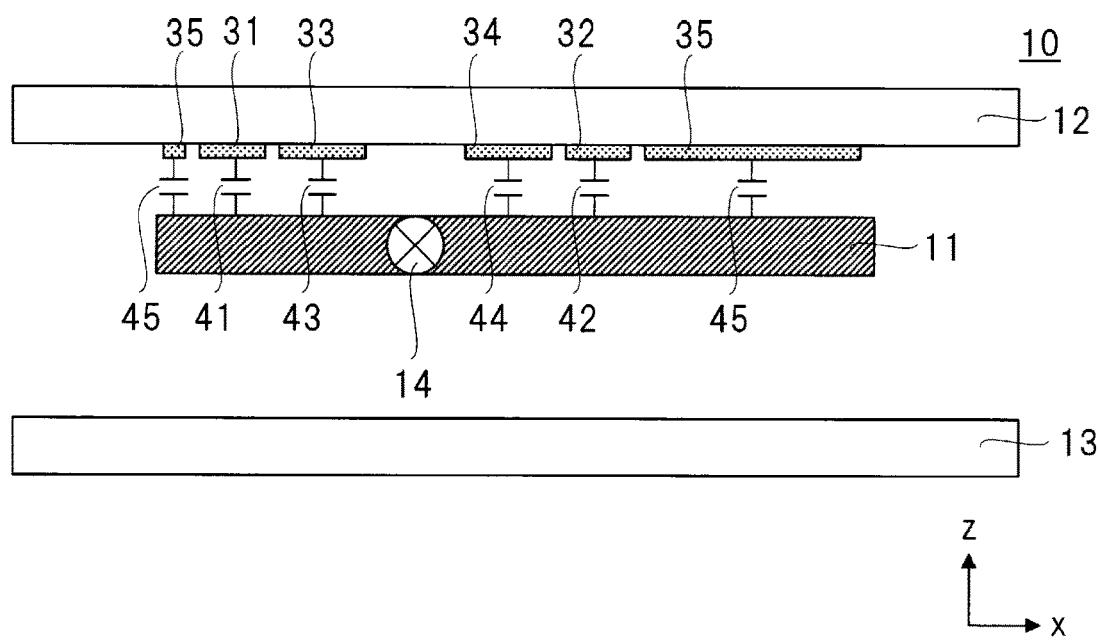

In addition, as illustrated in FIG. 3, the DC servo capacitive element 45 may be formed in the first movable portion 21. FIG. 3 is a view illustrating an example of a device structure of a sensor element in another modified example, FIG. 3(a) is a plan view, FIG. 3(b) is a cross-sectional view taken along line A-A of FIG. 3(a). In the example illustrated in FIG. 3, in the upper substrate 12, in a region facing the first symmetrical region 23, in addition to the first signal detection electrode 31 and the first AC servo control electrode 33, a DC servo control electrode 35 is formed extending in the y direction and arranged so as to be symmetric with respect to the axis (line A-A) in the x direction. The DC servo capacitive element 45 is formed between the DC servo control electrode 35 formed on the upper substrate 12 and the first movable portion 21. The DC servo control electrode 35 is arranged at a position farther from the rotation shaft 14 than the first signal detection electrode 31.

Returning to FIG. 1, the first signal detection capacitive element 41 and the second signal detection capacitive element 42 are capacitors for detecting the application of acceleration, respectively. Namely, the acceleration is detected by detecting changes in capacitance of the first signal detection capacitive element 41 and the second signal detection capacitive element 42, which occur when the acceleration is applied to the mass body 11. At this time, since the capacitance changes of the first signal detection capacitive element 41 and the second signal detection capacitive element 42 are reverse to each other in phase with respect to a certain acceleration, differential detection can be performed by applying the detection voltages reverse to each other in phase to the first signal detection electrode 31 and the second signal detection electrode 32. However, in principle, if one of the first signal detection capacitive element 41 and the second signal detection capacitive element 42 exists, it is possible to detect acceleration, and even such a configuration has no problem.

The first AC servo capacitive element 43 and the second AC servo capacitive element 44 are capacitors for applying the AC component servo voltage that generates a force in a direction opposite to the direction of the AC component (AC component=vibration component) of the acceleration detected by the first signal detection capacitive element 41 and the second signal detection capacitive element 42. As a result, it is possible to detect the acceleration by feedback operation. In addition, since the AC servo capacitive elements are provided in both of the first movable portion 21 and the second movable portion 22, although the first AC servo capacitive element 43 and the second AC servo capacitive element 44 are formed on the upper substrate 12 or the lower substrate 13, bidirectional servo control is possible. In FIG. 1 (FIG. 2 and FIG. 3), the AC servo capacitive elements are formed on the upper substrate 12.

The resulting effect is that the difference (variation) in capacitance value between the first AC servo capacitive element 43 and the second AC servo capacitive element 44 can be greatly reduced. Typically, it is necessary to correct the variation in capacitance value by using a compensation circuit or the like, and thus, there is a problem in that the large variation in capacitance value may increase the circuit scale (increase cost) and adversely influence the operation. In particular, since the capacitance value is inversely proportional to the distance between the electrodes, the variation in inter-electrode distance directly leads to the variation in capacitance value. For this reason, it will be easily understood by those skilled in the art that, from the viewpoint of manufacturing, in comparison with the case of forming a capacitance pair in different substrates, that is, on both surfaces of the upper substrate 12 and the lower substrate 13, the case of forming a capacitance pair in the same substrate, that is, one of the upper substrate 12 and the lower substrate 13 is advantageous for reducing the variation in distance between the electrodes.

The DC servo capacitive element 45 has a capacitor for applying a DC-component servo voltage that generates a force in a direction opposite to the direction of the DC component (DC component=gravitational component) of the acceleration detected by the first signal detection capacitive element 41 and the second signal detection capacitive element 42. Since the direction of the gravitational acceleration is invariable, when the acceleration sensor element 10 is installed with attention to the positional relationship between the second movable portion 22 and the DC servo control electrode 35, there is no need to perform bidirectional servo control. Specifically, the arrangement relationship between the second movable portion 22 and the DC servo control electrode 35 is illustrated in FIG. 1. In the case where the mass of the second movable portion 22 is larger than the mass of the first movable portion 21, the acceleration sensor element 10 may be installed so that the direction of the gravitational acceleration is in the −z direction. At this time, it is not necessary that the direction vector of the gravitational acceleration is exactly in the −z direction, and it is sufficient that the z-component of the direction vector is arranged to be negative.

In this manner, the first AC servo capacitive element 43 and the second AC servo capacitive element 44, which require bidirectional servo control, are arranged in the first symmetrical region 23 and the second symmetrical region 24, and only the DC servo capacitive element 45 for which even only unidirectional servo control is sufficient is arranged in the asymmetrical region 25. As a result, it is possible to obtain effects of effectively reducing a variation in capacitance value between the first signal detection capacitive element 41 and the second signal detection capacitive element 42 and a variation in capacitance value between the first AC servo capacitive element 43 and the second AC servo capacitive element 44 and of efficiently utilizing the surface areas of the first movable portion 21 and the second movable portion 22 as a capacitive element.

<Operation of Acceleration Sensor According to Embodiment>

The acceleration sensor according to the embodiment is configured by using the acceleration sensor element 10 as described above, and hereinafter, the operation thereof will be described with reference to FIG. 4.

Figure 4:
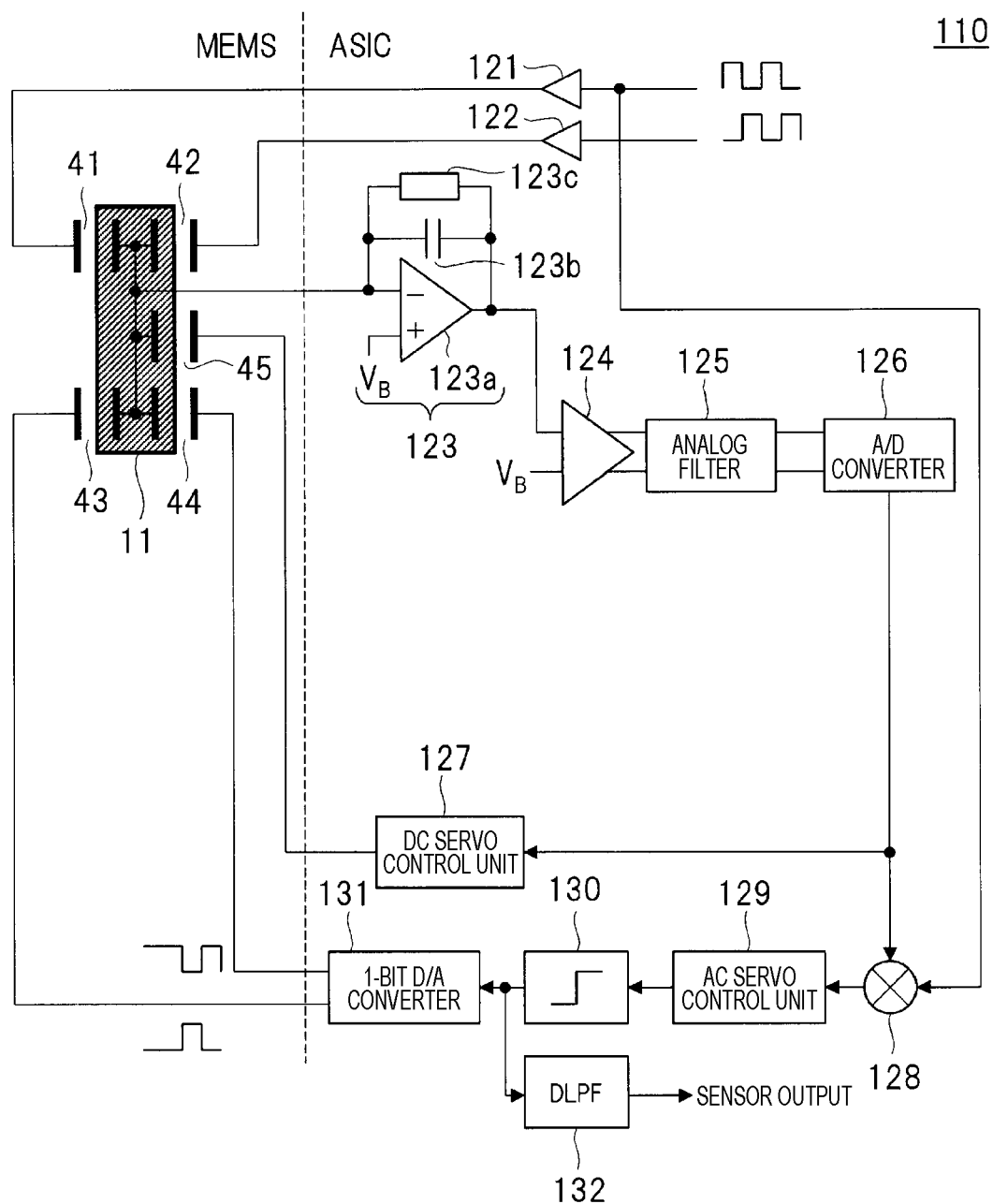
FIG. 4 is a block diagram illustrating an example of a configuration of an acceleration sensor according to an embodiment.

FIG. 4 is a block diagram illustrating an example of the configuration of the acceleration sensor according to the embodiment. FIG. 4 illustrates an example of an ASIC (Application Specific Integrated Circuit) used together with the above acceleration sensor element (MEMS; Micro Electro Mechanical Systems).

The ASIC 110 is configured to include drivers 121 and 122, a charge amplifier 123, an amplifier 124, an analog filter 125, an A/D converter 126, a DC servo control unit 127, a demodulator 128, an AC servo control unit 129, a 1-bit quantizer 130, a 1-bit D/A converter 131, and a DLPF (digital low pass filter) 132.

The drivers 121 and 122 receive, as inputs, a non-inverted modulation clock and an inverted modulation clock which are reverse to each other in phase, respectively, and applies voltages to the first signal detection electrode 31 of the first signal detection capacitive element 41 and the second signal detection electrode 32 of the second signal detection capacitive element 42, respectively.

The charge amplifier 123 is a C/V conversion circuit configured to include an operational amplifier 123a, a feedback capacitor 123b connected in parallel between an input and an output of the operational amplifier 123a, and a high resistor 123c. In the operational amplifier 123a, a signal from the mass body 11 is input to an inverting input, and a reference voltage $V_B$ is applied to a non-inverting input. The charge amplifier 123 converts capacitance change values of the first signal detection capacitive element 41 and the second signal detection capacitive element 42, which is proportional to the displacement of the mass body 11, into a voltage, and the output of the charge amplifier 123 is connected to the amplifier 124.

One input of the amplifier 124 is connected to the charge amplifier 123, the other input thereof is applied with the reference voltage $V_B$, and the output is connected to the analog filter 125. The amplifier 124 receives, as inputs, the voltage converted by the charge amplifier 123 and the reference voltage $V_B$, performs differential amplification, and outputs the differentially-amplified voltage to the analog filter 125.

The analog filter 125 has an input connected to the amplifier 124 and an output connected to the A/D converter 126. The analog filter 125 is a circuit that receives, as an input, the voltage differentially-amplified by the amplifier 124, removes a noise component included in the voltage, and outputs the voltage to the A/D converter 126.

The A/D converter 126 has an input connected to the analog filter 125 and an output connected to the DC servo control unit 127 and the demodulator 128. The A/D converter 126 is a circuit that receives, as an input, the analog voltage of which noise has been removed by the analog filter 125, converts the analog voltage into a digital value, and outputs the digital value to the DC servo control unit 127 and the demodulator 128.

The DC servo control unit 127 has an input connected to the A/D converter 126 and an output connected to the DC servo capacitive element 45. The DC servo control unit 127 is a circuit that receives, as an input, the digital value converted by the A/D converter 126, determines a servo voltage (DC component) that generates a force in the direction opposite to the detection signal on the basis of the digital value, and applies the servo voltage the DC servo control electrode 35 of the DC servo capacitive element 45.

For example, the DC servo control unit 127 is configured to include a demodulator similar to the demodulator 128, a narrowband digital low pass filter for extracting only a DC component of the input acceleration, a control signal processing unit, a multi-bit D/A converter for converting a digital output value of the control signal processing unit into an analog voltage, and supplying a servo voltage, and the like. Although the D/A converter is a multi-bit unit, since the D/A converter can be operated at low speed for DC control, power consumption does not increase, or noise does not increase. This denotes that the power consumption and the noise are not influenced by the control state of the DC servo. For example, although it assumed that the acceleration sensor element 10 is installed in a state in which the direction of the gravitational acceleration is deviated from the −z direction, the power consumption and noise are not influenced. This is advantageous in the seismic prospecting system described later. In addition, the −z direction is the direction opposite to the arrow indicating the z direction in FIGS. 1 to 3.

In addition, the main purpose of the DC servo is to cancel the gravitational acceleration at the time when the sensor module is arranged in the vertical direction (component of gravitational acceleration in the sensor sensitivity axis direction in the case where the sensor module is inclined from the vertical direction). Since this component is static and unidirectional, the determination operation of the servo voltage (DC component) by the DC servo control unit 127 is performed, for example, by installing an acceleration sensor and is performed only one time before the detection of the AC acceleration signal is started. During the measurement of the AC acceleration signal, it may be sufficient to continue to apply the determined servo voltage (DC component) to the DC servo capacitive element 45.

The demodulator 128 has two inputs connected to the A/D converter 126 and the input of the driver 121 and an output connected to the AC servo control unit 129. This demodulator 128 is a circuit that receives, as input, the digital value converted by the A/D converter 126 and the modulation clock input to the driver 121, multiplies the digital value by the modulation clock, and demodulates a capacitance change value proportional to the displacement of the mass body 11 caused by the application of the acceleration, and outputs the capacitance change value to the AC servo controller 129.

The AC servo control unit 129 has an input connected to the demodulator 128 and an output connected to the 1-bit quantizer 130. The AC servo control unit 129 is a circuit that receives, as an input, the capacitance change value demodulated by the demodulator 128, determines a servo value (AC component) for generating a force in a direction opposite to the detection signal on the basis of the capacitance change value, and outputs the servo value to the 1-bit quantizer 130.

The 1-bit quantizer 130 has an input connected to the AC servo controller 129 and an output connected to the 1-bit D/A converter 131. The 1-bit quantizer 130 is a circuit that receives, as an input, the servo value (AC component) determined by the AC servo control unit 129, quantizes the servo value with 1 bit, and outputs the quantized servo value to the 1-bit D/A converter 131. The output of the 1-bit quantizer 130 is also input to DLPF (digital low pass filter) 132, a high frequency component is suppressed by the DLPF 132, and the output of the DLPF 132 becomes the output of the final acceleration sensor.

The 1-bit D/A converter 131 has an input connected to the 1-bit quantizer 130 and an output connected to the first AC servo control electrode 33 of the first AC servo capacitive element 43 and the second AC servo control electrode 34 of the second AC servo capacitive element 44. The 1-bit D/A converter 131 is a circuit that receives, as an input, the 1-bit digital value quantized by the 1-bit quantizer 130, converts the digital value into an analog value, and applies the analog voltage to the first AC servo control electrode 33 of the first AC servo capacitive element 43 and the second AC servo control electrode 34 of the second AC servo capacitive element 44.

As described above, during the detection of the detection signal, the first AC servo capacitive element 43 and the second AC servo capacitive element 44 are applied with a voltage that generates a force in a direction opposite to the direction of the AC component of the detection signal of the acceleration by the first signal detection capacitive element 41 and the second signal detection capacitive element 42, and the DC servo capacitive element 45 is applied with a voltage that generates a force in a direction opposite to the direction of the DC component of the detection signal of the acceleration by the first signal detection capacitive element 41 and the second signal detection capacitive element 42.

Accordingly, in the embodiment, it is possible to implement a simultaneous operation method of signal detection and servo control. Furthermore, since separate voltages can be applied to the first AC servo capacitive element 43, the second AC servo capacitive element 44, and the DC servo capacitive element 45, respectively, individual control of the servo voltage (DC component) and the AC voltage (AC component) becomes possible. Accordingly, the dynamically controlled servo force becomes only the AC component of the acceleration, and thus, the absolute value of the servo force to be dynamically controlled can be reduced, so that it is possible to reduce the output voltage of the 1-bit D/A converter 131 for AC servo. As a result, it is possible to suppress noise caused by the AC servo control and to increase the sensitivity.

Alternatively, since the capacitance values of the first AC servo capacitive element 43 and the second AC servo capacitive element 44 can be reduced, the power consumption for charging and discharging the first AC servo capacitive element 43 and the second AC servo capacitive element 44 can be reduced. In addition, since the DC servo control is static, the DC servo capacitive element 45 is not steadily charged and discharged. Alternatively, since the areas of the first AC servo control electrode 33 and the second AC servo control electrode 34 arranged in the first symmetrical region 23 and the second symmetrical region 24 can be reduced, it is possible to reduce the size of the sensor element. Namely, by arranging the DC servo capacitive element 45 in the asymmetrical region 25 in the acceleration sensor element 10, high sensitivity, low power consumption, and miniaturization of the acceleration sensor can be realized. In the embodiment, it is possible to obtain the above-described effects.

Other Effects of Embodiment

Next, other effects of the embodiment will be described. As described above, one of the features of the acceleration sensor element 10 according to the embodiment is that, by forming the fixed electrode of each capacitance pair on one of the upper substrate 12 and the lower substrate 13, the acceleration sensor having a bidirectional servo control function can operate. The other effect is that the substrate on which the fixed electrode is not formed can be formed to be sufficiently separated from the mass body 11.

Hereinafter, the effect will be described by exemplifying the case where the fixed electrodes are formed on the upper substrate 12 illustrated in FIG. 1. Between the mass body 11 and the upper substrate 12, a first signal detection capacitive element 41, a second signal detection capacitive element 42, a first AC servo capacitive element 43, a second AC servo capacitive element 44, a DC servo capacitive element 45 are formed. At this time, the distances between the electrodes forming the capacitors of the mass body 11 and the upper substrate 12 are generally formed to be about 3 μm or less. On the other hand, since the main purpose of the lower substrate 13 is to hermetically seal the mass body 11, the distance between the mass body 11 and the lower substrate 13 can be, for example, about 50 μm or more, and thus, the distance can be allowed to be sufficiently larger than the distance between the electrodes forming the capacitors of the mass body 11 and the upper substrate 12.

In general, the detection resolution (sensitivity) of an acceleration sensor manufactured by MEMS is strongly influenced by thermal motion (Brownian Noise; $B_N$) of ambient gas molecules. The $B_N$ is expressed by the following Mathematical Formula.

$$B_N = \frac{\sqrt{4k_B T c}}{m} \quad \text{[Mathematical Formula 1]}$$

Herein, $K_B$ is the Boltzmann constant, T is the absolute temperature, c is the attenuation coefficient, and m is the mass of the mass body. In order to implement a highly-sensitive acceleration sensor, it is necessary to decrease c or to increase m. However, in order to increase m, it is necessary to enlarge the mass body 11, so that a die area increases, that is, the cost increases. On the other hand, in the case of a parallel-plate-type vibrating body, since c is inversely proportional to the cube of a distance between the vibrating body and the fixed electrode, in order to reduce c, it is effective that the distance between the mass body 11 and the upper substrate 12 or the distance between the mass body 11 and the lower substrate 13 is increased. In the embodiment, since the distance between the mass body 11 and the lower substrate 13 can be made sufficiently large, there is an advantage in that the influence of the lower substrate 13 on the detection resolution (sensitivity) can be almost ignored.

In addition, the acceleration sensor element 10 according to the embodiment has also an advantage in terms of mounting. Typically, in order to operate as an acceleration sensor, it is necessary to mount the acceleration sensor element 10 and the ASIC 110 in a package material. As a method of mounting the MEMS sensor, there are known methods of fixing directly the sensor to the mounting surface, bonding the sensor with a die attach film, bonding through a die attach touch metallization layer, and the like. However, since these materials have different linear expansion coefficients from a material (for example, silicon) constituting the MEMS sensor, there is a problem in that these materials are easily influenced by thermal stress generated at the time of mounting. In this point, in the acceleration sensor element 10 of the embodiment, by utilizing the lower substrate 13 as a mounting surface, there is an effect in that the influence of the thermal stress can be alleviated.

Figure 5:
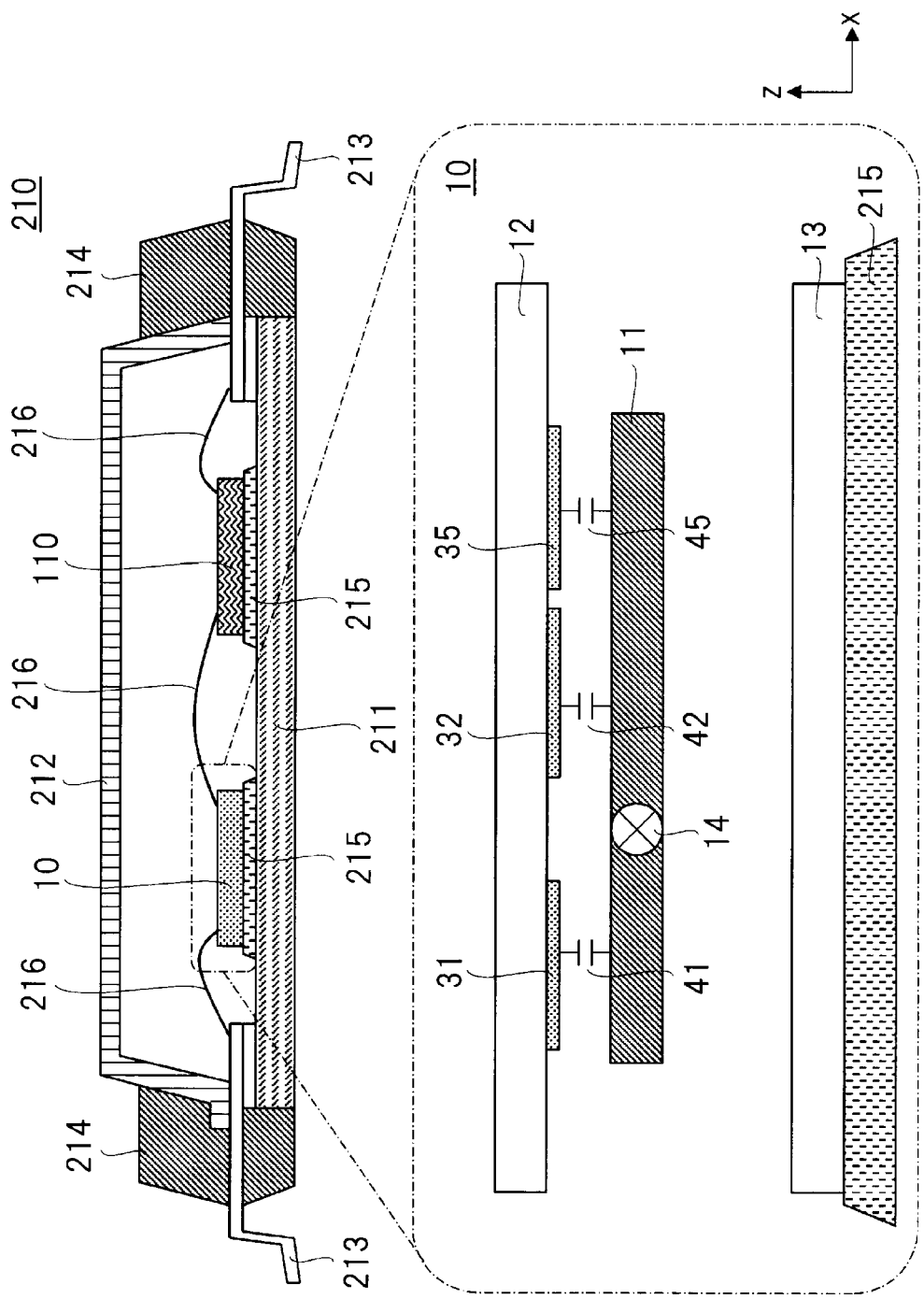
FIG. 5 is a cross-sectional view illustrating an example of mounting of an acceleration sensor in the embodiment.

Hereinafter, this point will be described. FIG. 5 is a cross-sectional view illustrating an example of mounting of the acceleration sensor according to the embodiment. FIG. 5 illustrates an example where the acceleration sensor element 10 and the ASIC 110 are mounted in the package 210. The package 210 has a bottom member 211, a cover member 212, lead wires 213, and a sealing member 214 and is made of, for example, ceramic or the like. The acceleration sensor element 10 and the ASIC 110 are mounted inside the package 210 and are bonded to the package 210 through a bonding material 215. At this time, the acceleration sensor element 10 is bonded with the lower substrate 13 as a mounting surface. In addition, the acceleration sensor element 10, the ASIC 110, and the lead wires 213 are electrically wired by wires 216 as necessary. In addition, FIG. 5 merely illustrates one example of mounting by using a package, but it does not limit the shape, positional relationship, and the like of the constituent elements of the package.

As the bonding material 215, for example, an adhesive such as an epoxy-based die bonding resin or a silicone-based die bonding resin, a die attach film, a solder through a metallized layer, or the like is used. At this time, in order to bond the acceleration sensor element 10 and the ASIC 110 to the package 210 with appropriate strength, heat treatment is inevitable.

On the other hand, in the case where the heat treatment is performed, since the linear expansion coefficients of the materials constituting the bonding material 215 and the acceleration sensor element 10 are different from each other, thermal stress is generated, so that the acceleration sensor element 10 may be deformed. When such deformation occurs, the respective capacitance values formed in the acceleration sensor element 10 change, which may adversely affect the operation of the acceleration sensor. On the other hand, by utilizing the lower substrate 13 on the mounting surface of the acceleration sensor element 10, it is possible to expect an effect in that the lower substrate 13 absorbs the influence of deformation caused by the thermal stress, so that that the mass body 11 and the upper substrate 12 are hardly influenced. Therefore, it is possible to obtain an effect in that the respective capacitance values with respect to the first signal detection capacitive element 41, the second signal detection capacitive element 42, the first AC servo capacitive element 43, the second AC servo capacitive element 44, and the DC servo capacitive element 45 relating to the performance of the acceleration sensor are hardly influenced. In other words, according to the embodiment, it is possible to provide an acceleration sensor having high resistance to thermal stress generated during the mounting.

In addition, the acceleration sensor mounted on the package is used in such a direction that the −z direction illustrated in FIG. 5 coincides with the direction of the z component of the gravitational acceleration. Namely, the direction is not limited to the case where the direction of the gravitational acceleration exactly coincides with the −z direction, but also includes the case where, in a range where the z component of the gravitational acceleration is negative, the direction components in the x direction and the y direction are included. In addition, the −z direction is the direction opposite to the arrow indicating the z direction in FIG. 5, and the y direction is the direction perpendicular to the paper surface of FIG. 5. In this point as well, as described above, the direction of the DC servo force generated by the servo voltage (DC component) applied to the DC servo capacitive element 45 coincides with the direction in which the gravitational acceleration is canceled, which is advantageous.

<Characteristics of Seismic Prospecting System According to Embodiment>

Figure 6:
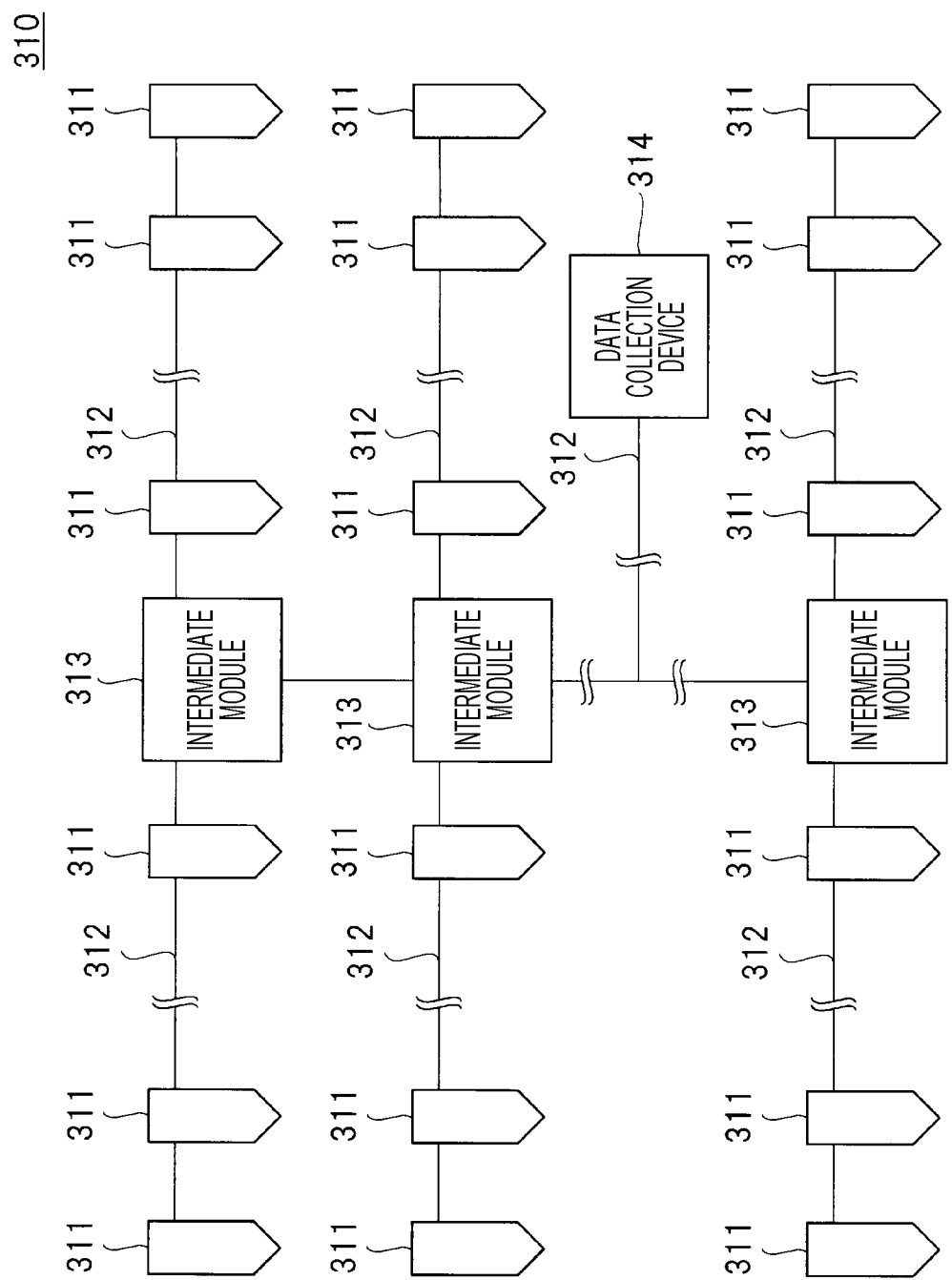
FIG. 6 is a configuration diagram illustrating an example of a seismic prospecting system according to an embodiment.

Next, a seismic prospecting system configured by using the acceleration sensor according to the embodiment will be described. FIG. 6 is a configuration diagram illustrating an example of a seismic prospecting system 310 according to the embodiment.

In reflective seismic prospecting, as a form of seismic prospecting, shock waves or continuous waves are generated on the ground surface by using dynamite, a vibrator or the like (not shown) as the seismic source, and reflected waves reflected on the underground reflective surface to comeback to the ground is measured by a geophone deployed on the ground surface and is analyzed, so that a depth distribution and a subsurface structure of the underground reflective surface are prospected. At this time, a seismic prospecting system configured with a plurality of geophones is used for a geophone deployed on the ground surface.

For example, as illustrated in FIG. 6, the seismic prospecting system 310 is configured to include a plurality of geophones 311, a cable 312 for connecting the plurality of geophones 311 in series and parallel and transmitting signals obtained from the geophones 311, an intermediate module 313 for connecting the cables, and a data collection device 314 for collecting the obtained signals. An acceleration sensor configured using the acceleration sensor element 10 and the ASIC 110 is used as the geophone 311. For this reason, a signal detected by each geophone 311 installed on the ground surface is converted into an electric signal and transmitted to the intermediate module 313 or directly to the data collection device 314 through the cable 312. At this time, each geophone 311 transmits its own position information together with the detection signal to identify each geophone 311.

In addition, data transmission from each geophone 311 is not limited to wired communication through the cable 312, and data transmission may also be performed by using wireless communication instead of the cable 312. Alternatively, it may also be possible to prepare a data recording device in the geophone 311 and directly collect data from each geophone 311 after the seismic prospecting.

Figure 7:
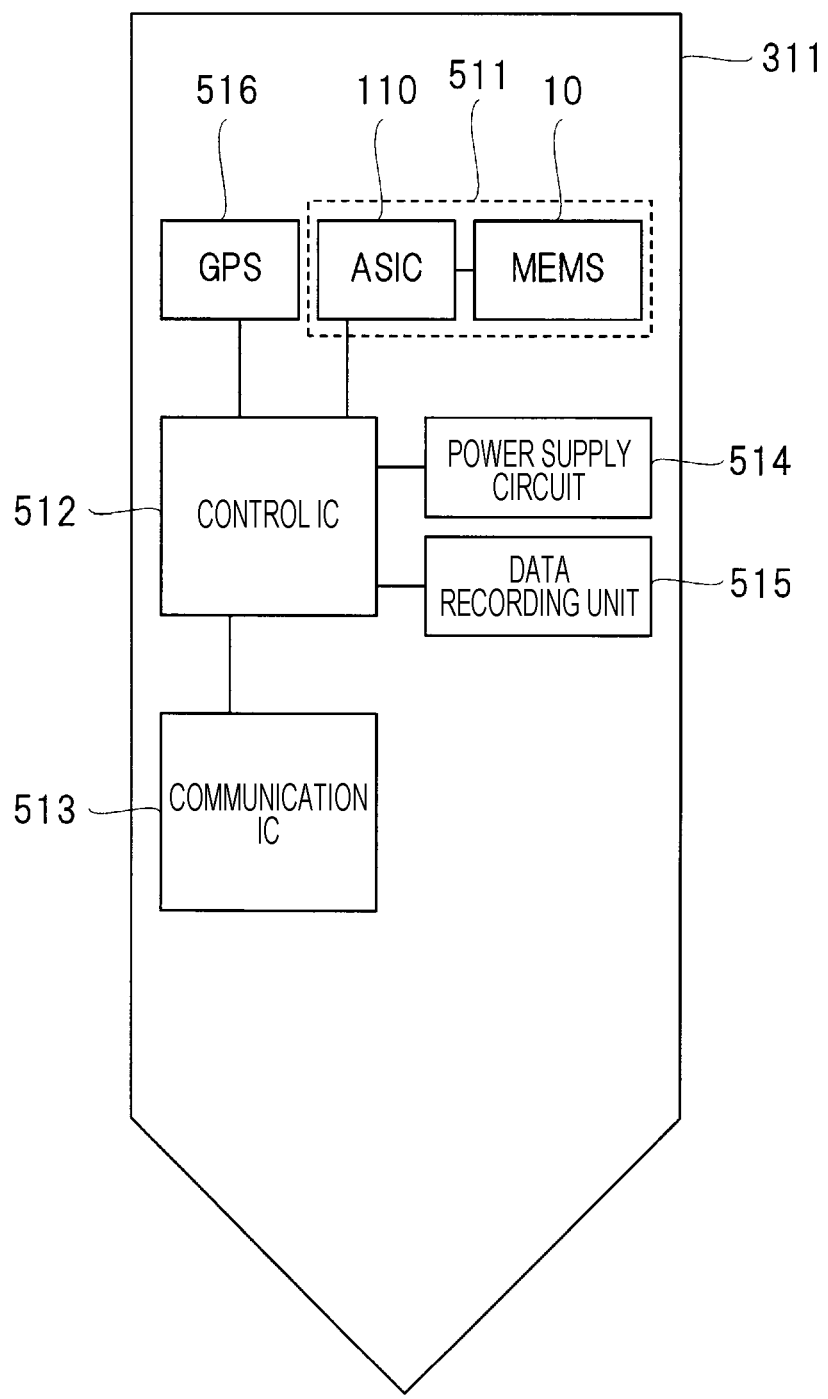
FIG. 7 is a block diagram illustrating an example of a configuration of a geophone of a seismic prospecting system according to an embodiment.

An example of the geophone 311 will be described with reference to FIG. 7. FIG. 7 is a block diagram illustrating an example of the configuration of the geophone 311 of the seismic prospecting system 310 according to the embodiment. The geophone 311 is configured to include an acceleration sensor 511 configured by using the acceleration sensor element 10 and the ASIC 110, a control IC (Integrated Circuit) 512, a communication IC 513, a power supply circuit 514, a data recording unit 515, and a GPS (Global Positioning System) 516.

The control IC 512 is an integrated circuit that is responsible for overall control of the geophone 311 and performs control of, for example, converting a signal detected by the acceleration sensor 511 into an electric signal, transmitting the electric signal to the data collection device 314 through the communication IC 513, or the like. The communication IC 513 is an integrated circuit that transmits the signal detected by the acceleration sensor 511 and converted into the electric signal to the data collection device 314. The power supply circuit 514 is a circuit that generates a power necessary for the operation of each circuit of the geophone 311 and supplies the power to each circuit. With respect to the power supply circuit 514, for example, in the case where the geophone 311 is of a wired communication type, a battery is unnecessary, but in the case where the geophone is of a wireless communication type, the power supply circuit is configured to include a battery. The data recording unit 515 is a recording unit that records various data such as a detection signal detected by the acceleration sensor 511 and position information measured by the GPS 516. The GPS 513 is a system for measuring the current position on the earth in each geophone 311 deployed on the ground.

As the seismic prospecting system increases in scale, the number of installed geophones 311 increases, and thus, installation efficiency becomes important.

Figure 8:
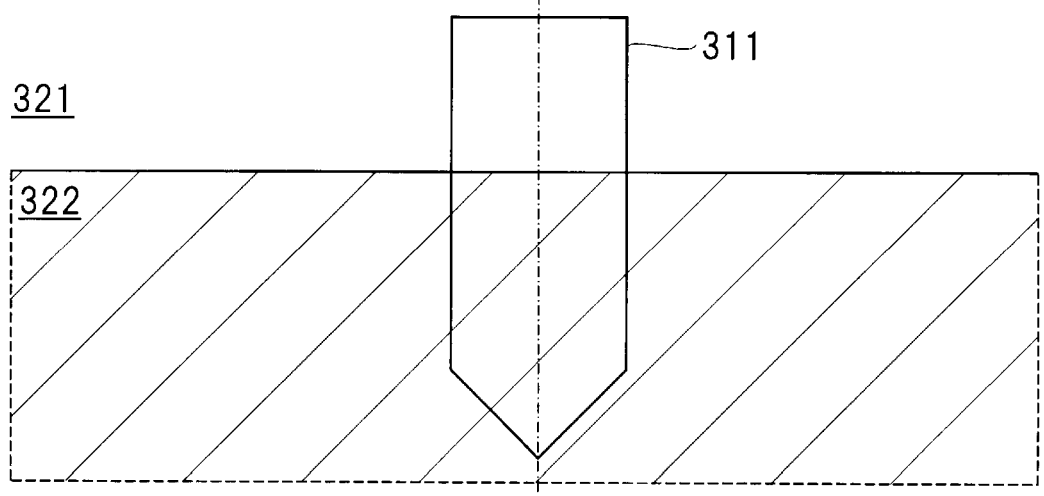
FIGS. 8(a) and 8(b) are explanatory views illustrating an example of installation of a geophone of the seismic prospecting system according to the embodiment.
Figure 8:
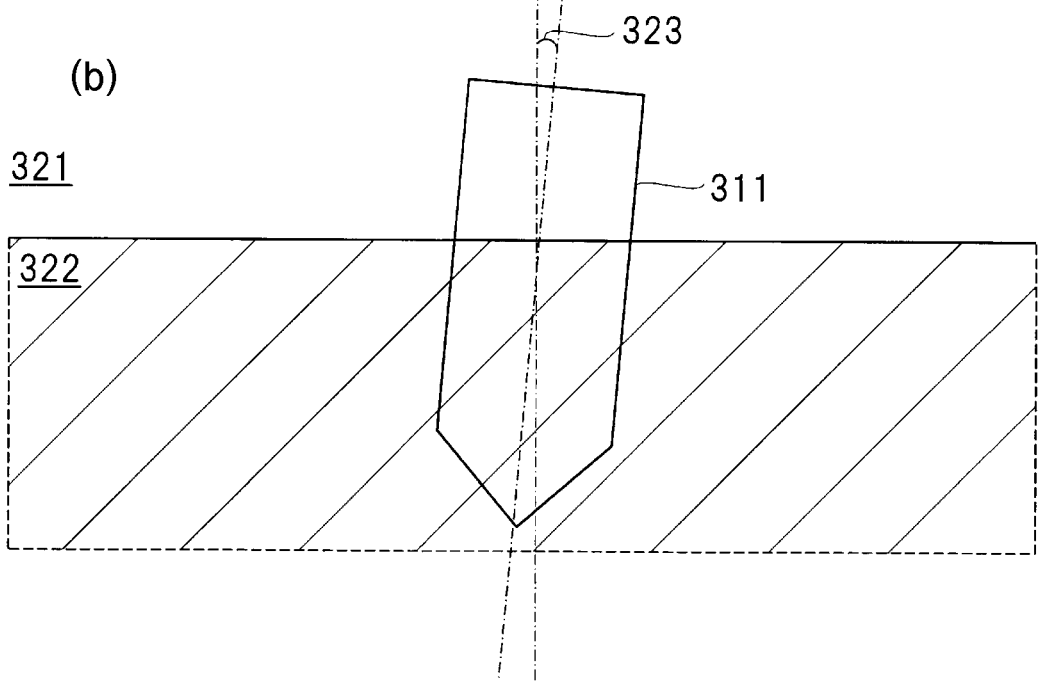

An example of installation of the geophone 311 will be described with reference to FIG. 8. FIGS. 8(a) and 8(b) are explanatory views illustrating an example of installation of the geophone 311 of the seismic prospecting system 310 according to the embodiment. For example, as illustrated in FIG. 8, the geophone 311 is installed so that a portion thereof is exposed on the ground 321 and the remaining portion thereof is buried in the underground 322. At this time, in the coil-type geophone in the related art, as illustrated in FIG. 8(a), it is necessary to horizontally install the geophone 311 at the installation site, which may be a factor of deteriorating the installation efficiency. However, in the MEMS-type geophone 311 according to the embodiment, since it is possible to measure and correct the inclination of the geophone 311 with reference to the gravitational acceleration, as illustrated in FIG. 8(b), the inclination at the time of the installation is allowed to some extent, which is advantageous in terms of installation efficiency. On the other hand, in the MEMS-type acceleration sensor in the related art, since it is not possible to individually control the DC servo control and the AC servo control, there is a possibility that the detection resolution (sensitivity) varies depending on the inclination at the time of the installation (control state of the DC servo).

In this point, in the geophone 311 using the acceleration sensor element 10 and the ASIC 110 according to the embodiment, the measurement can be performed without being influenced by the detection resolution (sensitivity) of the gravitational acceleration that varies depending on the inclination angle 323 at the time of installation, which is advantageous. Namely, even though all the inclination angles 323 (about 0 to 20 degrees) at the time of installation of the plurality of geophones 311 are different, it is possible to perform the measurement without deteriorating the detection resolution (sensitivity).

As described above, the geophone 311 according to the embodiment is installed so that the direction in which the upper substrate 12 is arranged to face the mass body 11 of the acceleration sensor element 10 and the direction of gravitational acceleration applied to the mass body 11 are opposite to each other with a certain allowable range. Then, in order to correct the inclination at the time of installation, by using the DC voltage applied to the DC servo control electrode 35, the inclination angle 323 which is an angle formed by the first direction in which the mass body 11 is displaceable with respect to the rotation shaft 14 and the direction of gravitational acceleration applied to the mass body 11 is measured.

Figure 9:
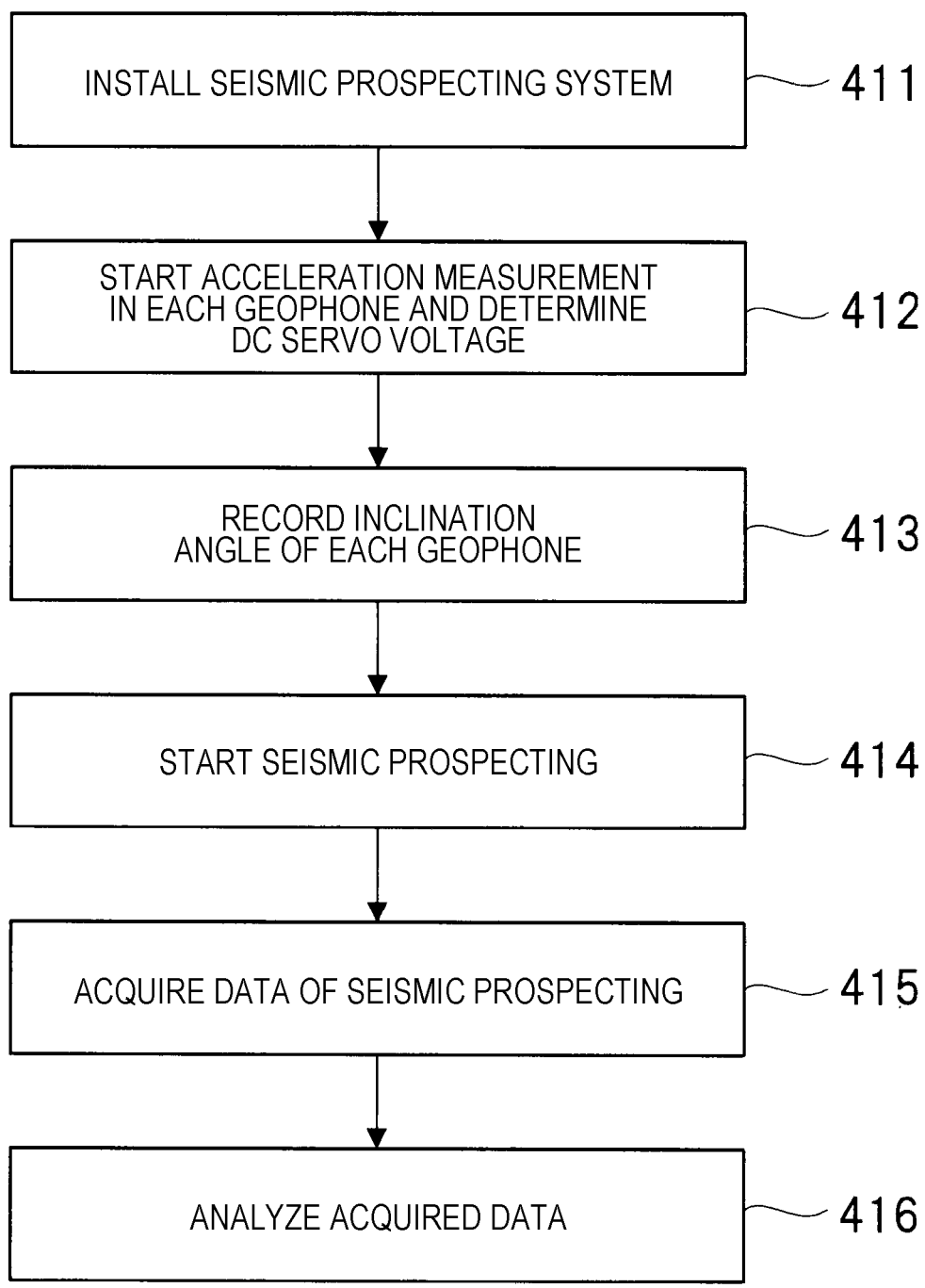
FIG. 9 is a flowchart illustrating an example of a seismic prospecting using the seismic prospecting system according to the embodiment.

FIG. 9 is a flowchart illustrating an example of the seismic prospecting using the seismic prospecting system 310 according to the embodiment. In the seismic prospecting system 310 including the plurality of geophones 311, each geophone 311 is installed at a desired position before starting the measurement (step 411). Next, each geophone 311 is activated, and thus, the acceleration measurement is started in each geophone 311, so that the DC servo voltage is determined (step 412). At this time, a command for activating each geophone 311 is given from, for example, the data collection device 314 illustrated in FIG. 6. Next, in the individual geophone 311, the data of the inclination angle 323 of each geophone 311 measured from the determined DC servo voltage is recorded (step 413). The data of the inclination angle 323 is recorded in the data recording unit 515 of each geophone 311.

After that, the seismic prospecting is started by using seismic sources such as dynamite and vibrator (step 414). At this time, a command for starting the seismic prospecting is given to each geophone 311 from the data collection device 314 illustrated in FIG. 6, and the data of the seismic prospecting is recorded in the data recording unit 515 in each geophone 311. Then, the data of the seismic prospecting is acquired (step 415). The data of the seismic prospecting is acquired by, for example, the data collection device 314 illustrated in FIG. 6. Finally, data analysis is performed on the basis of the acquired data of the seismic prospecting (step 416). This data analysis is performed by using, for example, an analysis device connectable to the data collection device 314 illustrated in FIG. 6, an analysis device provided separately from the data collection device 314, and the like.

In the seismic prospecting using the seismic prospecting system 310 according to the embodiment, the data of the inclination angle 323 of each geophone 311 recorded in step 413 may be used as correction data at the time of the data analysis. In addition, each flow after the installation of each geophone 311 can be mounted on software or hardware and can be operated on the data collection device 314 or on an operation system that is separately configured.

Although the present invention made by the present inventor has been described in detail with reference to the embodiments, the present invention is not limited to the above-described embodiments, but various modifications can be made without departing from the spirit of the invention. For example, the above-described embodiments have been described in detail in order to explain the present invention in an easy-to-understand manner and are not necessarily limited to those having all the configurations described. In addition, with respect to a portion of the configurations of the embodiments, other configurations can be added, deleted, or replaced.

REFERENCE SIGNS LIST 10 acceleration sensor element
11 mass body
12 upper substrate
13 lower substrate
14 rotation shaft
15 fixed portion
16 spring portion
21 first movable portion
22 second movable portion
23 first symmetrical region
24 second symmetrical region
25 asymmetrical region
31 first signal detection electrode
32 second signal detection electrode
33 first AC servo control electrode
34 second AC servo control electrode
35 DC servo control electrode
41 first signal detection capacitive element
42 second signal detection capacitive element
43 first AC servo capacitive element
44 second AC servo capacitive element
45 DC servo capacitive element
310 seismic prospecting system
311 geophone

The invention claimed is:

1. A geophone, comprising:
an acceleration sensor including a mass body displaceable in a first direction with respect to a rotation shaft,
wherein the mass body of the acceleration sensor includes:
a first movable portion, including a conductor, extending in one direction with respect to the rotation shaft and a second movable portion, including a conductor, extending in another direction with respect to the rotation shaft and having an area larger than an area of the first movable portion,
wherein the acceleration sensor includes an upper substrate facing a first side of the first movable portion and the second movable portion,
wherein a DC servo control electrode is disposed on the upper substrate facing an asymmetrical region which is a region outside a symmetrical region of the first movable portion and the second movable portion,
wherein a DC servo capacitive element is formed between the second movable portion and the DC servo control electrode and applies a servo voltage to the DC servo control electrode, and
wherein an angle formed between the first direction and a direction of gravitational acceleration applied to the mass body is measured by using a DC voltage applied to the DC servo control electrode.

2. The geophone according to claim 1,
wherein the acceleration sensor is installed so that:
a lower substrate is arranged at a position facing a second side the first movable portion and the second movable portion that is opposite to the first side;
the DC servo control electrode is formed only on the upper substrate; and a direction of arrangement of the upper substrate with respect to the mass body and a direction of gravitational acceleration applied to the mass body are opposite to each other.

3. A seismic prospecting system, comprising:
a plurality of geophones equipped with an acceleration sensor including a mass body displaceable in a first direction with respect to a rotation shaft,
wherein the mass body of the acceleration sensor includes:
a first movable portion, including a conductor, extending in one direction with respect to the rotation shaft and a second movable portion, including a conductor, extending in another direction with respect to the rotation shaft and having an area larger than an area of the first movable portion,
wherein the acceleration sensor includes an upper substrate facing a first side of the first movable portion and the second movable portion,
wherein a DC servo control electrode is disposed on the upper surface substrate facing an asymmetrical region which is a region outside a symmetrical region of the first movable portion and the second movable portion,
wherein a DC servo capacitive element is formed between the second movable portion and the DC servo control electrode and applies a servo voltage to the DC servo control electrode, and
wherein an angle formed between the first direction and a direction of gravitational acceleration applied to the mass body is measured by using a DC voltage applied to the DC servo control electrode.

4. The seismic prospecting system according to claim 3, wherein the acceleration sensor is installed so that:
an upper substrate is arranged at a position facing in the same direction as the first movable portion and the second movable portion;
a lower substrate is arranged at a position facing in the other direction from the first movable portion and the second movable portion;
the DC servo control electrode is formed only on the upper substrate; and
a direction of arrangement of the upper substrate with respect to the mass body and a direction of gravitational acceleration applied to the mass body are opposite to each other.

5. The seismic prospecting system according to claim 4, wherein, in each of the plurality of geophones, by installing each geophone, acceleration measurement of each geophone is started, a DC servo voltage of the acceleration sensor mounted on each geophone is determined, each geophone records an inclination angle at the time of installation, and seismic prospecting is started in each geophone, and
wherein the seismic prospecting system comprises a data collection device that acquires data of the seismic prospecting from each geophone.

6. The seismic prospecting system according to claim 5, comprising an analysis device that analyzes the data of the seismic prospecting acquired by the data collection device.

* * * * *